(12) United States Patent
Onishi et al.

(10) Patent No.: US 7,538,027 B2
(45) Date of Patent: May 26, 2009

(54) FABRICATION METHOD FOR SEMICONDUCTOR INTERCONNECTIONS

(75) Inventors: Takashi Onishi, Kobe (JP); Masao Mizuno, Kobe (JP); Mikako Takeda, Kobe (JP); Susumu Tsukimoto, Kyoto (JP); Tatsuya Kabe, Sakyo-ku (JP); Toshifumi Morita, Sakyo-ku (JP); Miki Moriyama, Sakyo-ku (JP); Kazuhiro Ito, Sakyo-ku (JP); Masanori Murakami, Sakyo-ku (JP)

(73) Assignee: Kobe Steel, Ltd., Kobe-shi (JP)

( * ) Notice: Subject to any disclaimer, the term of this patent is extended or adjusted under 35 U.S.C. 154(b) by 256 days.

(21) Appl. No.: 11/532,796

(22) Filed: Sep. 18, 2006

(65) Prior Publication Data

US 2007/0218690 A1    Sep. 20, 2007

(30) Foreign Application Priority Data

Mar. 20, 2006 (JP) ............................. 2006-077443

(51) Int. Cl.
*H01L 21/4763* (2006.01)
(52) U.S. Cl. .................. 438/637; 438/629; 438/638; 438/640; 438/668
(58) Field of Classification Search .............. 438/632, 438/648
See application file for complete search history.

(56) References Cited

U.S. PATENT DOCUMENTS 6,090,701 A * 7/2000 Hasunuma et al. .......... 438/632

(Continued)

FOREIGN PATENT DOCUMENTS

JP    2001-7050    1/2001

OTHER PUBLICATIONS

"Self-formation of barrier layer by using Cu alloy interconnection", Research Society of Atom Migration and Stress Problem in LSI Interconnection(s), 2004, 4 cover pages and pp. 28-29 (with English summary).

(Continued)

*Primary Examiner*—Thanh V Pham
*Assistant Examiner*—Caleb Henry
(74) *Attorney, Agent, or Firm*—Oblon, Spivak, McClelland, Maier & Neustadt, P.C.

(57) ABSTRACT

There is provided a fabrication method for interconnections, capable of embedding a Cu-alloy in recesses in an insulating film, and forming a barrier layer on an interface between the an insulating film and Cu-interconnections, without causing a rise in electric resistivity of the interconnections when fabricating semiconductor interconnections of the Cu-alloy embedded in the recesses provided in the insulating film on a semiconductor substrate. The fabrication method for the interconnections may comprise the steps of forming the respective recesses having a minimum width not more than 0.15 μm, and a ratio of a depth thereof to the minimum width (a depth/minimum width ratio) not less than 1, forming a Cu-alloy film containing Ti in a range of 0.5 to 3 at %, and N in a range of 0.4 to 2.0 at % over the respective recesses, and subsequently, annealing the Cu-alloy film to not lower than 200° C., and pressurizing the Cu-alloy film to not less than 50 MPa to thereby embed the Cu-alloy film into the respective recesses.

17 Claims, 3 Drawing Sheets

U.S. PATENT DOCUMENTS

| | | | |
|---|---|---|---|
| 6,171,957 B1 * | 1/2001 | Maekawa | 438/672 |
| 6,204,143 B1 * | 3/2001 | Roberts et al. | 438/396 |
| 6,727,172 B1 * | 4/2004 | Jong et al. | 438/626 |
| 6,841,477 B1 * | 1/2005 | Uchibori | 438/687 |
| 6,852,614 B1 * | 2/2005 | Compaan et al. | 438/603 |

OTHER PUBLICATIONS

U.S. Appl. No. 11/765,006, filed Jun. 19, 2007, Onishi et al.

U.S. Appl. No. 11/532,796, filed Sep. 18, 2006, Onishi et al.

* cited by examiner

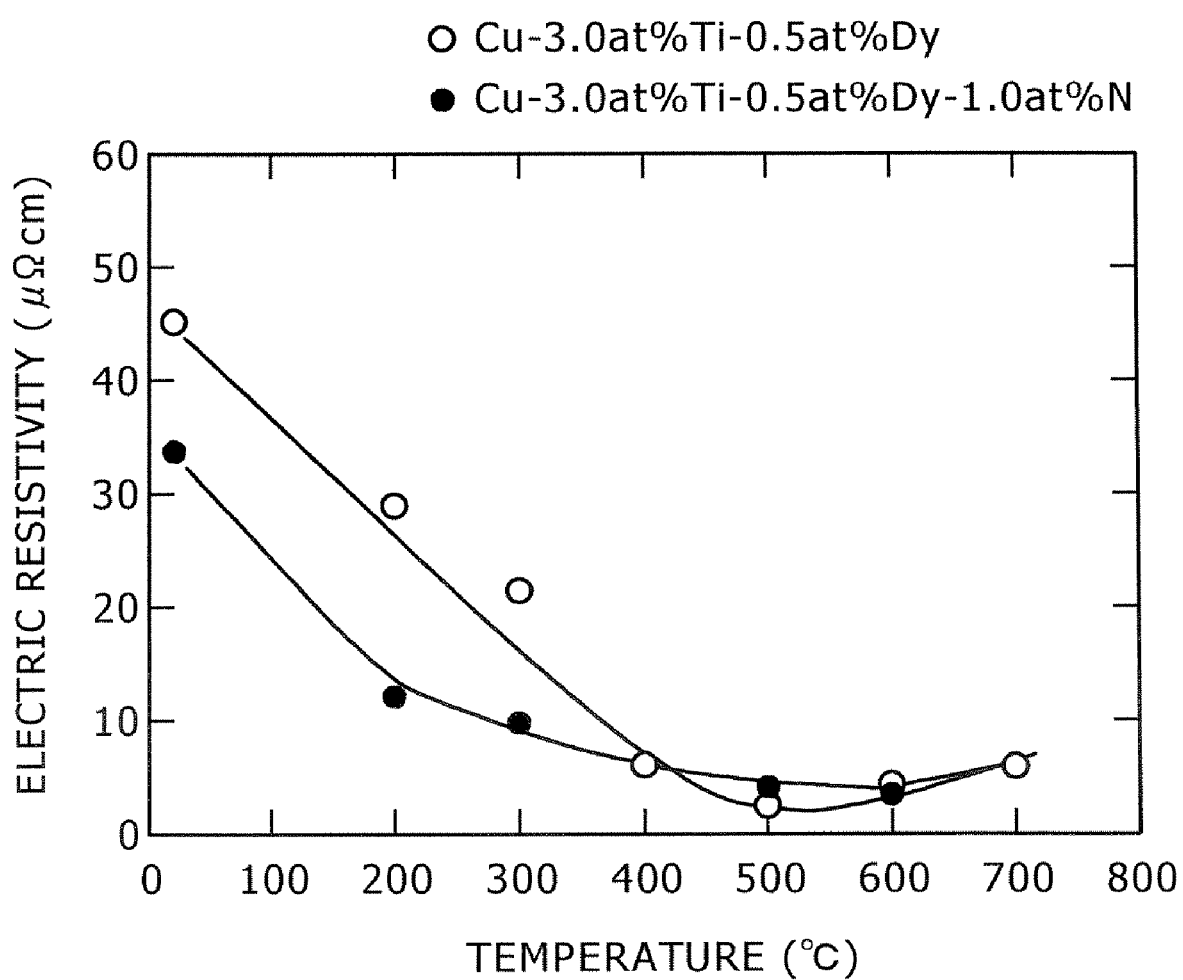

FABRICATION METHOD FOR SEMICONDUCTOR INTERCONNECTIONS

FIELD OF THE INVENTION

The invention relates to a semiconductor device, and in particular, to a fabrication method for interconnections in a semiconductor device such as an Si semiconductor device represented by, for example, a ULSI (an ultra-large scale integrated circuit), and so forth.

BACKGROUND OF THE INVENTION

In order to meet demands for higher integration of an LSI (a large scale integrated circuit), and faster signal propagation, a design rule for the LSI has lately been on a reduction trail, and reduction has been implemented in respect of an interconnection pitch, a line width, an interval between interconnections, and the number of interlayer connection holes (vias) for connecting the interconnections with each other. Further, in order to cope with higher integration of a semiconductor device, formation of interconnections in a multilayer structure have been under study, and there has been a further increase in a ratio of a depth of an interconnection groove (trench) to a width thereof (an interconnection groove depth/width ratio), and a ratio of a depth of the interlayer connection hole for connecting the respective interconnections with each other to a diameter thereof (a connection hole depth/diameter ratio).

Further, as a result of shrinkage and higher integration of interconnection circuits, resistance of interconnections themselves has come to pose a problem. This is because an increase in the resistance of the interconnections will lead to delay in signal transmission. Accordingly, an attempt is being made to form Cu-based interconnections by use of an interconnection material based on Cu (hereinafter referred to also as a Cu-based interconnection material) capable of achieving reduction in electrical resistance more than a conventional interconnection material based on Al (hereinafter referred to also as an Al-based interconnection material)

As a method for forming the Cu-based interconnections of the multilayer structure, there has been known the damascene wiring technology (refer to, for example, Patent document 1). This technology is represented by a method whereby the interconnection grooves and the interlayer connection holes (hereinafter all those together are referred to also as recesses) are formed in an interlayer dielectric provided on a semiconductor substrate, surfaces of the interconnection grooves, and so forth are covered by the Cu-based interconnection material, such as pure Cu, Cu alloy, and so forth, and the Cu-based interconnection material is rendered fluid by applying heat thereto under pressure to be embedded in the recesses, thereby forming the interconnections.

In this connection, if the interlayer dielectric is in direct contact with the Cu-based interconnection material in the case of using the Cu-based interconnection material as the interconnection material, this will cause Cu to be diffused into the interlayer dielectric, thereby resulting in deterioration of insulation properties of the interlayer dielectric. Accordingly, in order to prevent diffusion of Cu into the interlayer dielectric, it is necessary to provide a barrier layer between the interlayer dielectric and the Cu-based interconnections. Because the barrier layer is required to exhibit blocking properties even when heated to a high temperature in a range of about 500 to 700° C. for causing the Cu-based interconnections to be embedded in the recesses, a metal nitride film, such as a TaN film, TiN film, and so forth, is used for the barrier layer. The barrier layer described, however, is high in electric resistivity in comparison with a metal film, thereby posing a problem of raising, in effect, an electric resistivity of the interconnections. It is difficult, however, to form the barrier layer so as to be small and uniform in thickness to thereby lower the electric resistivity of the interconnections. Moreover, as described in the foregoing, there has lately been a further decrease in the width of the interconnection groove, and the diameter of the connection hole while there has been a further increase in the interconnection groove depth/width ratio, and the connection hole depth/diameter ratio, so that it has become more difficult to form the barrier layer.

Under such circumstances as described, in order to uniformly form an extremely thin barrier layer on an interface between the Cu-based interconnections, and the interlayer dielectric, the inventor, et al. have already proposed formation of a Ti-concentration layer as the extremely thin barrier layer at the interface between the Cu-based interconnections, and the interlayer dielectric by taking advantage of a non-equilibrium solid solution phenomenon with much attention being focused on vapor quenching in the sputtering method (refer to Non-patent Document 1, and so forth). With this technology, a Cu-alloy containing Ti having a small solubility limit in relation to Cu is formed over the interconnection grooves, and the connection holes to be subsequently heated under pressure, thereby causing Cu and Ti to be separated into two phases, so that Ti is caused to undergo abnormal diffusion on the interface between the Cu-based interconnections, and the interlayer dielectric, or on the surface of the Cu-based interconnections, thereby forming the Ti-concentration layer. In particular, the Ti-concentration layer formed on the interface between the Cu-based interconnections, and the interlayer dielectric acts as the barrier layer for preventing the diffusion of Cu into the interlayer dielectric. Now, if the interlayer dielectric is an oxide based film (for example, an $SiO_2$-base film), Ti diffused in the interface forms TiOx, however, if the Ti-concentration layer increase in thickness to some extent, reaction between Ti and oxygen comes to a stop, so that a thickness of the Ti-concentration layer does not become excessively large, and a rise in the electric resistivity of the interconnections can be controlled.

However, since the Cu-alloy containing Ti, even if heated to a high temperature, is poor in fluidity (hereinafter referred to also as reflow properties), it is difficult to embed the Cu-alloy into every corner of the recesses. Furthermore, as previously described, the width of the interconnection groove, and the diameter of the connection hole have lately become increasingly smaller while the interconnection groove depth/width ratio, and the connection hole depth/diameter ratio have lately become increasingly greater, so that it has become more difficult to embed the Cu-alloy into the recesses. [Patent Document 1] JP-A No. 7050/2001 (refer to Claims) [Non-patent Document 1] "Self-formation of Barrier Layer by Using Cu alloy interconnection", draft papers for the 10th research conference, Research Society of Atom Migration and Stress Problem in LSI Interconnection(s) (2004, pp. 28 to 29)

SUMMARY OF THE INVENTION

Under the circumstances described as above, the invention has been developed, and it is an object of the invention to provide a fabrication method for interconnections, capable of embedding a Cu-alloy in recesses in an insulating film, and forming a barrier layer on an interface between the an insulating film, and Cu-interconnections, without causing a rise in electric resistivity of the interconnections when fabricating semiconductor interconnections of the Cu-alloy embedded in the recesses provided in the insulating film on the top surface of a semiconductor substrate.

The inventor, et al. have continued strenuous studies on a method for forming a Ti-concentration layer on the interface between the insulating film and the Cu-interconnections, without causing the rise in the electric resistivity of the interconnections while enhancing the reflow properties of the Cu-alloy in order to embed the Cu-alloy in the recesses. As a result, they have found out that the reflow properties of the Cu-alloy can be enhanced by appropriately adjusting chemical composition of the Cu-alloy to be formed over the recesses without inhibiting the formation of the Ti-concentration later, and the electric resistivity of the interconnections can be lowered by appropriately controlling annealing and pressurizing conditions, according to the chemical composition of the Cu-alloy to be formed over the recesses, thereby completing the invention.

In accordance with one aspect of the present invention having resolved above-described problems, there is provided a fabrication method for semiconductor interconnections of a Cu-alloy embedded in respective recesses provided in an insulating film on a semiconductor substrate, said method comprising the steps of forming the respective recesses having a minimum width not more than 0.15 μm, and a ratio of a depth thereof to the minimum width (a depth/minimum width ratio) not less than 1, forming a Cu-alloy film containing Ti in a range of 0.5 to 3 at %, and N in a range of 0.4 to 2.0 at % over the respective recesses, and subsequently, annealing the Cu-alloy film to not lower than 200° C., and pressurizing the Cu-alloy film to not less than 50 MPa to thereby embed the Cu-alloy film into the respective recesses.

With the method according to the present invention, the semiconductor interconnections may be fabricated by forming a Cu-alloy film containing Ti in a range of 0.5 to 3 at %, and Dy in a range of 0.01 to 3 at % over the respective recesses, and subsequently, annealing the Cu-alloy film to not lower than 400° C., and pressurizing the Cu-alloy film to not less than 50 MPa to thereby embed the Cu-alloy film into the respective recesses. The Cu-alloy film may also contain N in a range of 0.4 to 2.0 at %.

The Cu-alloy film containing N may be formed by the sputtering method under an atmosphere of an inert gas containing $N_2$ in a range of 2.5 to 12.5 vol. %.

With the present invention, because of N and Dy, contained in the Cu-alloy, it is possible to enhance the reflow properties of the Cu-alloy upon application of an annealing and pressurizing treatment. Those elements N and Dy do not interfere with formation of a Ti-concentration layer, due to the application of the annealing and pressurizing treatment, so that the Ti-concentration layer is formed on the interface between the insulating film, and the Cu-alloy, thereby preventing Cu from undergoing diffusion into the insulating film. Furthermore, an electric resistivity of the interconnections can be lowered by controlling annealing and pressurizing conditions, according to N content and Dy content of the Cu-alloy.

BRIEF DESCRIPTION OF THE DRAWINGS

FIG. 4 is a graph showing a relationship between an annealing temperature and an electric resistivity with reference to specimens No. 65 and No. 66, in Table 4.

DETAILED DESCRIPTION OF THE PREFERRED EMBODIMENTS

Figure 1A:
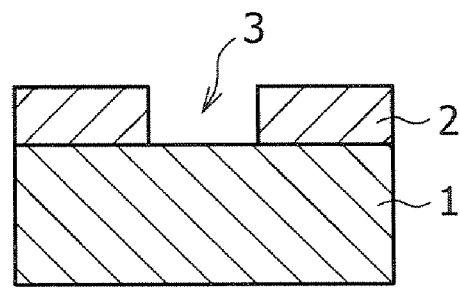
FIG. 1 is view broadly illustrating one embodiment of a fabrication method for semiconductor interconnections, according to the invention.
Figure 1B:
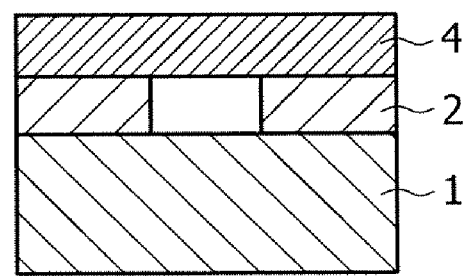
Figure 1C:
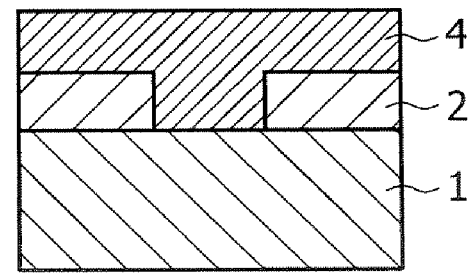
Figure 1D:
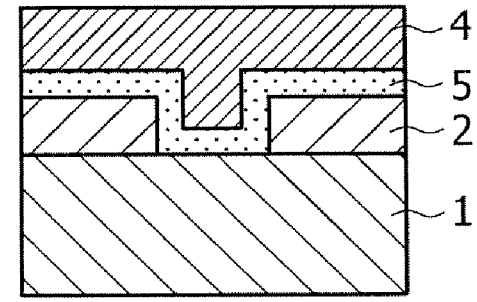

One embodiment of a fabrication method for semiconductor interconnections, according to the invention, is broadly described with reference to FIG. 1. With the invention, the semiconductor interconnections can be fabricated by providing a Cu-alloy film 4 containing Ti (refer to FIG. 1B) over recesses 3 provided in an insulating film 2 on the surface of a semiconductor substrate 1 (refer to FIG. 1A) by use of, for example, the sputtering method, and by applying an annealing and pressurizing treatment to the Cu-alloy film 4 to thereby cause the Cu-alloy film 4 to be embedded in the recesses 3 (refer to FIG. 1C). Further, with the invention, at the time of application of the annealing and pressurizing treatment, Ti contained in the Cu-alloy film 4 undergoes diffusion into an interface between the Cu-alloy film 4 and the insulating film 2, to be highly concentrated on the interface, thereby forming a Ti-concentration layer 5 (refer to FIG. 1D). The Ti-concentration layer 5 acts as a barrier layer for preventing Cu from undergoing diffusion into the insulating film.

In order to form the Ti-concentration layer at the time of the application of the annealing and pressurizing treatment as described, it is important to form the Cu-alloy film 4 containing Ti in a range of 0.5 to 3 at % over the recesses. If Ti content is less than 0.5 at %, a quantity of Ti concentrated on the interface between the insulating film 2 and the Cu-alloy film 4 becomes insufficient, so that the Ti-concentration layer 5 formed on the interface becomes excessively small in thickness, thereby failing to secure blocking properties. Further, if the Ti content is insufficient, the Ti-concentration layer formed along the interface becomes discontinuous, thereby causing the blocking properties to undergo deterioration. Accordingly, the Ti content is not less than 0.5 at %, preferably not less than 1 at %. However, if the Ti content is excessively high, this will render it impossible to enhance the reflow properties of the Cu-alloy at high temperatures even with addition of N and Dy to the Cu-alloy, as described later, and it will become difficult to embed the Cu-alloy in the recesses, so that the interconnections cannot be formed. Further, because a film thickness of the Ti-concentration layer formed on the interface between the insulating film and the Cu-alloy is limited to a degree, an excessive portion of the Ti content, making no contribution to the formation of the Ti-concentration layer, is either dissolved into the Cu-alloy, in solid solution state, or forms deposits inside the Cu-alloy. Such Ti in solid solution state, and Ti deposits, as described, create a cause for raising an electric resistivity of the interconnections. Accordingly, the Ti content need be not more than 3 at %, preferably not more that 2.5 at %. In this connection, since a portion of Ti contained in the Cu-alloy undergoes diffusion into the surface of the Cu-alloy, as well, a non-equilibrium solid solution state of Ti in Cu will be eliminated if the Ti content is within the rage described as above, so that a rise in the electric resistivity of the interconnections does not occur.

The Ti-concentration layer is composed of a compound of an element constituting the insulating film, and Ti, and a nitride (TiN) of N contained in Cu. Accordingly, in the case where an oxide-based film (for example, $SiO_2$-based film) is used for the insulating film, the Ti-concentration layer composed mainly of $TiO_x$ is formed.

There is no particular limitation to the film thickness of the Ti-concentration layer formed when the interconnections are fabricated, but the film thickness is preferably not less than 1 nm in order to ensure the blocking properties. The film thickness is more preferably not less than 2 nm, and further preferably not less than 3 nm. If the Ti-concentration layer becomes excessively large in thickness, however, this will cause the electric resistivity of the interconnections to rise, so that the film thickness is preferably not more than on the order of 17 nm, more preferably not more than 16 nm, and further preferably not more than 15 nm.

Incidentally, there exists the following relationship between the composition of the Cu-alloy and the reflow properties thereof. As in the case of, for example, a pure Cu thin film, if grain growth has already occurred thereto in a state prior to the annealing and pressurizing treatment, the pure Cu thin film does not exhibit high-temperature fluidity. However, in the case where crystal grains in the state prior to the annealing and pressurizing treatment (that is, as-deposited state) are fine, undergoing considerable grain growth due to heat treatment, there occurs abrupt atomic diffusion in the course of the grain growth, so that high-temperature fluidity (high-temperature reflow properties) emerges. Further, if the crystal grains, in the state prior to the annealing and pressurizing treatment, are fine, there occurs grain boundary sliding in a high temperature zone, thereby causing the high-temperature fluidity to appear. With the Cu-alloy containing Ti, the crystal grains thereof, in the state prior to the annealing and pressurizing treatment, become fine owing to a crystal grain miniaturization effect caused by Ti. However, there exists a problem in that the Cu-alloy containing Ti is strong in solid solution hardening owing to Ti, so that grain growth at the time of the heat treatment is blocked, thereby resulting in difficulty with exhibiting fluidity.

For that reason, with the present invention, it is important to form a Cu-alloy not only containing Ti in the range described as above, but also containing the following:

(1) N in a range of 0.4 to 2.0 at %;
(2) Dy in a range of 0.01 to 3 at %; or
(3) N in the range of 0.4 to 2.0 at %, and Dy in the range of 0.01 to 3 at %;

The followings are the reasons why the reflow properties when heated to high temperature are enhanced if N and Dy are contained.

(1) The case of N in the range of 0.4 to 2.0 at %

Because a Cu-alloy thin film prepared by causing N to be forcefully turned into solid solution state, in the state prior to the annealing and pressurizing treatment, is capable of attaining miniaturization of crystal grains, and concurrently undergoing considerable grain growth by annealing, the Cu-alloy thin film is excellent in high-temperature fluidity. It is presumed that a Cu—Ti—N base alloy thin film exhibits such a grain growth behavior as described because there occurs an abrupt change in stress condition owing to release of a $N_2$ gas from the Cu-alloy in a annealing process. Further, it is presumed that in the case of the Cu—Ti—N base alloy thin film, because the release of the $N_2$ gas occurs in the neighborhood 200° C. before reaching a temperature region (300 to 500° C.) where restoration of the crystal grains occurs during the annealing process, there will be an increase in the number of defects (for example, point defects, cluster defects, and so forth) in the film, and presence of a multitude of the defects causes vigorous atomic diffusion in the temperature region (300 to 500° C.) for the restoration of Cu crystal grains, thereby promoting softening and deformation of the Cu crystal grains, so that enhancement of the high-temperature fluidity results.

Further, as heat treatment is applied to the Cu—Ti—N base alloy thin film, N in the solid solution state, within the thin film, is released in the form of the $N_2$ gas to be removed from the Cu-alloy, so that resistance of the interconnections after annealing is decreased, and also, a low electric resistivity thereof can be ensured.

For the Cu—Ti—N base alloy thin film to exhibit such an effect as described, it is necessary that N contained therein falls in the range of 0.4 to 2.0 at %. If N content is less than 0.4 at %, it is not possible to sufficiently enhance the high-temperature fluidity of the Cu-alloy. Accordingly, the N content need be not less than 0.4 at %, preferably not less than 0.5 at %, and more preferably not less than 0.6 at %. However, if the N content exceeds 2.0 at %, toughness and stickiness of a metal thin film decreases, so that a film uniform in thickness cannot be formed. Further, an excessive portion of the N content cannot be removed out of the Cu-alloy even if heated, thereby causing an increase in the electric resistivity of the interconnections. Accordingly, the N content need be not more than 2.0 at %, preferably not more than 1.9 at %, and preferably not more than 1.8 at %.

(2) The case of Dy in the range of 0.01 to 3 at %

Dy is an element for causing lattice strain within the Cu—Ti—N base alloy thin film, thereby miniaturizing the Cu crystal grains, and forming no penetration grain boundary in the state prior to the annealing and pressurizing treatment, thereby destabilizing grain boundaries. Accordingly, the Cu-alloy containing Dy causes occurrence of grain boundary sliding when heated while causing little grain growth to occur even if heated to thereby maintains a fine crystal texture, so that high-temperature fluidity is exhibited. As a result, it is possible to embed the Cu-alloy in the recesses provided in the semiconductor substrate even if the recesses are narrow in width.

Further, as heat treatment is applied to a Cu—Ti—Dy base alloy thin film, Dy in the thin film undergoes diffusion into the interface between the Cu-alloy and the insulating film, and the surface of Cu-alloy as with the case of the Ti to be thereby highly concentrated, so that resistance of the interconnections after annealing is decreased, and a low electric resistivity thereof can be ensured.

For the Cu—Ti—Dy base alloy thin film to exhibit such an effect as described, it is necessary that Dy contained in the Cu alloy thin film falls in the range of 0.01 to 3 at %. If Dy content is less than 0.01 at %, crystal grains cannot be miniaturized, so that it is not possible to sufficiently enhance the high-temperature fluidity of the Cu-alloy. Accordingly, the Dy content need be not less than 0.01 at %, preferably not less than 0.1 at %, and more preferably not less than 0.2 at %. However, if the Dy content exceeds 3.0 at %, the toughness and stickiness of the metal thin film decreases, so that the film uniform in thickness cannot be formed. Further, in the case of the Dy content being excessively high, the diffusion of Dy, into the interface between the Cu-alloy and the insulating film, and into the surface of Cu-alloy, will become insufficient even if heated, resulting in an increase in the electric resistivity of the interconnections. Accordingly, the Dy content need be not more than 3.0 at %, preferably not more than 2.5 at %, and more preferably not more than 2 at %.

(3) The case of N in the range of 0.4 to 2.0 at %, and Dy in the range of 0.01 to 3 at %;

The Cu-alloy described as above contains Ti, and N, or Dy, however, N, together with Dy, may be contained in the Cu-alloy.

With the present invention, the Cu-alloy formed over the recesses may contain unavoidable impurities such as Ag, Mg, Na, Fe, Si, and so forth.

There is no particular limitation to a method of forming the Cu-alloy containing Ti, and N and/or Dy, however, in forming a thin film, methods such as, for example, the sputtering method, (arc) ion plating method, and so forth may be adopted. If the Cu-alloy thin film is formed by the sputtering, in particular, the Cu-alloy thin film is fewer in the cluster defects than a Cu thin film formed by, for example, electroplating, so that there occurs deterioration in the high-temperature fluidity. With the present invention, however, even if the Cu-alloy film is formed by the sputtering, since the Cu-alloy is caused to contain N and Dy, it is possible to enhance the high-temperature fluidity. There is described hereinafter a case of forming the Cu-alloy by the sputtering.

The sputtering may be applied under an atmosphere of an inert gas by using a Cu-alloy target containing Ti, or a chip on target with a Ti piece stuck to the surface of a pure Cu target, as a sputtering target in order to form the Cu-alloy containing Ti, and by using a Cu-alloy target containing Ti and Dy, or a chip on target with a Ti piece and Dy piece, stuck to the surface of the pure Cu target, as the sputtering target in order to form the Cu-alloy containing Dy. In order to cause the Cu-alloy described as above to contain N, the sputtering may be applied to the Cu-alloy under an atmosphere of an inert gas containing the $N_2$ gas.

For the inert gas, use can be made of, for example, helium, neon, argon, krypton, xenon, radon, and so forth. Argon, and xenon are preferably used, and in particular, argon can be suitably used because it is relatively inexpensive. Further, the inert gas may contain the $H_2$ gas, in which case, it is possible to enhance the reflow properties of the Cu-alloy containing Ti and Dy, in particular.

In the case of the inert gas containing the $N_2$ gas, the $N_2$ gas in a range of 2.5 to 12.5 vol. % is preferably contained. This is to ensure the N content in the Cu-alloy. The lower limit of the $N_2$ gas is preferably 3 vol. %, and the upper limit thereof is preferably 12 vol. %. In the case of the sputtering under the atmosphere of the inert gas containing the $N_2$ gas, the inert gas preferably contains no $H_2$ gas.

There is no particular limitation to other sputtering conditions (for example, a base pressure, a sputtering gas pressure, discharge power density, substrate temperature, an inter-electrode distance, and so forth), which can be sufficiently adjusted within normal ranges.

Further, it is sufficient to change a film thickness of the Cu-alloy formed over the recesses so as to corresponding to a depth of each of the recesses, forming the Cu-alloy having the film thickness equivalent to at least the depth of each of the recesses.

With the present invention, the Cu-alloy formed over the recesses as above is embedded in the recesses after the annealing and pressurizing treatment. By varying annealing conditions at this point in time according to the composition of the Cu-alloy, the electric resistivity of the interconnections can be lowered.

In the case where the Cu-alloy does not contain Dy, it is sufficient to heat the Cu-alloy to 200° C. or higher. In contrast to the case where it is possible to cause the Cu-alloy, if heated to 200° C. or higher, to exhibit the high temperature reflow properties by the agency of N, N cannot be sufficiently removed out of the Cu-alloy if an annealing temperature is lower than 200° C., so that the electric resistivity of the interconnections becomes higher. The annealing temperature is preferably as high as possible, preferably 300° C. or higher, and more preferably 400° C. or higher.

Meanwhile, in the case where the Cu-alloy contains Dy, it is sufficient to heat the Cu-alloy to 400° C. or higher. In contrast to the case where it is possible to cause the Cu-alloy, if heated to 400° C. or higher, to exhibit the high temperature reflow properties by the agency of Dy, Dy does not undergo sufficient diffusion into the interface between the Cu-alloy and the interconnections, and the surface of Cu-alloy, if a annealing temperature is lower than 400° C., so that the electric resistance of the interconnections becomes higher. The annealing temperature is preferably as high as possible, preferably 450° C. or higher, and more preferably 500° C. or higher.

The upper limit of the annealing temperature is on the order of 700° C. regardless of whether or not the Cu-alloy contains Dy. This is because it is practically difficult to prepare an apparatus for annealing up to a temperature in excess of 700° C., and if the annealing temperature is excessively high, this will cause the semiconductor substrate to be deformed. Hence, the upper limit thereof is preferably 650° C., more preferably 550° C.

A pressure at 50 MPa is sufficient at the time of pressurization. The pressure is for embedding the Cu-alloy into the recesses. The pressure is preferably 80 MPa or higher, more preferably 100 MPa or higher. The pressure applied is preferably as high as possible, however, the pressure in excess of 200 MPa is too high to be practical, so that the upper limit of the pressure is on the order of 200 MPa, and preferably not higher than 150 MPa.

As described in the foregoing, with the present invention, the Cu-alloy is embedded in the recesses provided in the insulating film, and the recesses each have a minimum width not more than 0.15 µm, and a ratio of a depth thereof to the minimum width (hereinafter referred to also a depth/minimum width ratio) is not less than 1. Because in the case of the minimum width of the interconnection groove as well as the minimum width (the diameter) of the interlayer connection hole exceeding 0.15 µm, and in the case of the interconnection groove being shallow in depth with the ratio of the depth to the minimum width being less than 1, the Cu-alloy can be easily embedded in the recesses by the sputtering or the electroplating, so that there is no need for embedding the Cu-alloy by applying the annealing and pressurizing treatment. Hence, the present invention is suitable for application to the case where the Cu-alloy is embedded in the recesses (the interconnection grooves and the interlayer connection holes) each having the minimum width not more than 0.15 µm, and the ratio of the depth to the minimum width at not less than 1.

Further, as the minimum width decreases in size, so does an embedding ratio of the Cu-alloy, however, with the present invention, it is possible to implement relatively satisfactory embedding of the Cu-alloy even in the interconnection grooves and the interlayer connection holes, each having the minimum width not more than 0.12 µm, not more than 0.1 µm, or not more than 0.07 µm. Further, the higher the ratio of the depth to the minimum width, the poorer the embedding ratio of the Cu-alloy becomes, however, with the present invention, it is possible to implement relatively satisfactory embedding of the Cu-alloy even in the interconnection grooves and the interlayer connection holes, each having the ratio of the depth to the minimum width at not less than 2, 3, or 4. However, the upper limit of the ratio of the depth to the minimum width is on the order of 5.

There is no particular limitation to the type of the insulating film, and for the insulating film, use can be made of, for example, silicon oxide, silicon nitride, BSG (Boro-Silicate Glass), PSG (Phospho-Silicate Glass), BPSG (Boro-Phospho-Silicate Glass), TEOS (SiOF), and so forth.

The embodiment of the invention will be described in more detail with reference to working examples described hereinafter, however, it is to be understood that the invention is not limited thereto, and various changes and modifications may be made in the invention in the light of the above and following teachings without departing from the spirit or scope thereof.

WORKING EXAMPLE 1

A pure Cu thin film or respective Cu-alloy thin films, having various chemical compositions shown in Table 1, were formed to a thickness of 500 nm by DC-magnetron sputtering on the surface of a substrate with an insulating film (TEOS film: SiOF film) formed on the top surface of a silicon wafer.

For a sputtering system, use was made of a sputtering system of HSM-552 type, manufactured by Shimadzu Corporation, and sputtering was applied by use of the pure Cu target or the chip on target. For the chip on target, use was made of the pure Cu target (100 mm $\phi$) as a base, with 3 to 6 sheets of 5 mm square Ti chips stuck in the vicinity of erosion positions, respectively, on the surface thereof, and chemical compositions of the respective Cu-alloy thin films were changed by varying the number of the Ti chips.

The sputtering was carried out under a condition of the base pressure: not higher than $133 \times 10^{-6}$ Pa (not higher than $1 \times 10^{-6}$ Torr), an atmosphere gas at the time of the sputtering: Ar gas, the sputtering gas pressure: $267 \times 10^{-3}$ Pa ($2 \times 10^{-3}$ Torr), the discharge power density: 3.2 W/cm$^2$ (DC), the substrate temperature: room temperature (20° C.), and the inter-electrode distance: 55 mm.

A quantitative analysis was made on the composition (Ti, and Cu) of the thin films formed by the sputtering, and Ti content, and Cu content were determined by the emission spectroscopy with the use of an ICP emission spectral analyzer (ICP-8000 type) manufactured by Shimadzu Corporation.

After the formation of the thin films, an annealing and pressurizing treatment was applied thereto. The annealing and pressurizing treatment was carried out such that the thin film was pressurized to 150 MPa in the atmosphere of an Ar gas, and was heated from room temperature to 500° C. at a heating rate of 20° C./min to be held at that temperature for 120 min before being cooled down to room temperature at a cooling rate of 20° C./min.

Observation was made on cross-sections of respective specimens of the films after the treatment, each showing a stacked condition of the film, magnified 500,000 times by a transmission electron microscope (TEM). As a result, a TiO$_2$ layer as the Ti-concentration layer was found formed between the insulating film and the Cu-alloy. A thickness of the TiO$_2$ layer was measured, and measurement results are shown in Table 1 below.

Further, observation was made on the TiO$_2$ layer over 2000 nm in the longitudinal direction to check for any disrupted part (defect), thereby evaluating integrity of the TiO$_2$ layer. An evaluation criterion was adopted such that the case of the TiO$_2$ layer being undisrupted was evaluated as acceptable (good) while the case of the TiO$_2$ layer being disrupted was evaluated as unacceptable (poor). Evaluation results are shown in Table 1 below.

Still further, observation was made on the neighborhood of an interface between the insulating film and Cu (or the Cu-alloy), over 2000 nm along the interface, to check whether or not Cu is diffused into the insulating film. Checking on whether or not Cu was diffused into the insulating film was carried out by observing a portion of the insulating film, corresponding to its interface against Cu interconnections, by the TEM, thereby analyzing with EDS to find whether or not Cu is present. An evaluation was made such that in the case where Cu was not found diffused in the insulating film, the blocking properties of the TiO$_2$ layer was assumed excellent (acceptable: good) while in the case where Cu was found diffused in the insulating film, the blocking properties of the TiO$_2$ layer was assumed unsatisfactory (unacceptable: poor) Evaluation results are shown in Table 1 below.

TABLE 1

| No. | Chemical Composition (at %) Ti | Chemical Composition (at %) Cu | Thickness of TiO$_2$ Layer (nm) | Integrity of TiO$_2$ Layer | Blocking Properties |
|---|---|---|---|---|---|
| 1 | 0 | 100 | — | — | Poor |
| 2 | 0.2 | Balance | 0.3 | Poor | Poor |
| 3 | 0.5 | Balance | 1.0 | Good | Good |
| 4 | 1.0 | Balance | 4.8 | Good | Good |
| 5 | 2.0 | Balance | 11.8 | Good | Good |
| 6 | 3.0 | Balance | 16.2 | Good | Good |
| 7 | 5.0 | Balance | 21.1 | Good | Good |

As is evident from Table 1, the higher the Ti content of each of the Cu-alloy thin films formed by the sputtering, the greater the film thickness of the TiO$_2$ layer formed by application of the annealing and pressurizing treatment becomes. It has been found that if the annealing and pressurizing treatment was applied to the Cu-alloy thin film containing not less than 0.5 at % of Ti, in particular, the TiO$_2$ layer not less than 1.0 nm in film thickness was formed, so that the TiO$_2$ layer acts as the barrier layer for preventing the diffusion of Cu into the insulating film.

WORKING EXAMPLE 2

In this example, evaluation elements (TEGs) were used, each provided with an interconnection pattern (stripe pattern) 0.13 μm in width, 0.3 μm in depth, and 2.0 nm in length on an insulating film (TEOS film: SiOF film) formed on the top surface of a silicon wafer. A pure Cu thin film or respective Cu-alloy thin films, having various chemical compositions shown in Table 2, were formed to a thickness of 750 nm on the top surfaces of the respective TEGs by the sputtering, and parts of the respective TEGs, corresponding to the interconnection pattern, were covered by the respective thin films. The sputtering was carried out under the same condition as for Working Example 1 except that an atmosphere gas was changed in composition so as to be the atmosphere of the Ar gas, or an atmosphere of a mixed gas of Ar and N$_2$. A quantitative analysis of a constituent (N) of the thin films formed by the sputtering was made by the indophenol spectrophotometry after fractional distillation.

Next, the annealing and pressurizing treatment was applied to the TEGs covered with the respective Cu-alloy thin films. The annealing and pressurizing treatment was carried out such that the thin film was pressurized to 150 MPa in the atmosphere of the Ar gas, and was heated from room temperature to 500° C. at a heating rate of 20° C./min to be held at that temperature for 120 min before being cooled down to room temperature at a cooling rate of 20° C./min.

The respective TEGs after the annealing and pressurizing treatment were worked on so as to expose cross-sections of the interconnections with use of a FIB system (focused ion beam system) to observe the cross-sections on the basis of SIM images of the FIB system, thereby having examined embedding conditions (embedding properties) of pure Cu or respective Cu-alloys in respective interconnection grooves.

Evaluation of the embedding properties was made on the basis of an embedding ratio computed according to the following formula after making an image analysis of the SIM images of the cross-sections of the respective interconnection patterns. Observation was made on three varieties of the interconnection patterns, and an embedding ratio was computed with respect to the respective interconnection patterns, thereby having obtained an averaged embedding ratio. The embedding ratios thus obtained are shown in Table 2 below.

an embedding ratio (%)=[(the cross-section area of pure Cu or Cu alloy, embedded in an interconnection pattern)/(the cross-section area of an interconnection pattern)]×100

TABLE 2

| No. | Chemical Composition (at %) | | | | Sputtering Gas (vol. %) | | Embedding Ratio (%) |
|---|---|---|---|---|---|---|---|
| | Ti | N | Dy | Cu | $N_2$ | Ar | |
| 11 | 1.0 | — | 0.2 | Balance | — | 100 | 100 |
| 12 | 3.0 | — | 0.5 | Balance | — | 100 | 100 |
| 13 | 1.0 | 0.5 | — | Balance | 3.1 | Balance | 100 |
| 14 | 1.0 | 0.4 | 0.1 | Balance | 2.5 | Balance | 100 |
| 15 | 3.0 | 1.5 | — | Balance | 9.3 | Balance | 100 |
| 16 | 3.0 | 2.0 | — | Balance | 12.5 | Balance | 100 |
| 17 | 3.0 | 1.5 | 0.5 | Balance | 9.3 | Balance | 100 |
| 18 | 3.0 | 2.0 | 0.5 | Balance | 12.5 | Balance | 100 |
| 19 | 0.2 | — | — | Balance | — | 100 | 41.6 |
| 20 | 0.5 | — | — | Balance | — | 100 | 33.9 |
| 21 | 1.0 | — | — | Balance | — | 100 | 29.5 |
| 22 | 2.0 | — | — | Balance | — | 100 | 20.8 |
| 23 | 3.0 | — | — | Balance | — | 100 | 7.4 |
| 24 | 5.0 | — | — | Balance | — | 100 | 2.2 |
| 25 | 1.0 | — | 0.05 | Balance | — | 100 | 64.6 |
| 26 | 1.0 | 0.1 | — | Balance | 0.63 | Balance | 72.4 |
| 27 | — | — | — | 100 | — | 100 | 58.1 |
| 28 | — | 0.1 | — | Balance | 0.63 | Balance | 71.2 |
| 29 | — | 0.3 | — | Balance | 1.9 | Balance | 83.1 |
| 30 | — | 0.4 | — | Balance | 2.5 | Balance | 100 |
| 31 | — | 0.5 | — | Balance | 3.1 | Balance | 100 |
| 32 | — | 1.0 | — | Balance | 6.3 | Balance | 100 |
| 33 | — | 1.5 | — | Balance | 9.3 | Balance | 100 |
| 34 | — | 2.0 | — | Balance | 12.5 | Balance | 100 |
| 35 | — | — | 0.05 | Balance | — | 100 | 64.2 |
| 36 | — | — | 0.1 | Balance | — | 100 | 100 |
| 37 | — | — | 0.2 | Balance | — | 100 | 100 |
| 38 | — | — | 0.5 | Balance | — | 100 | 100 |
| 39 | — | — | 1.0 | Balance | — | 100 | 100 |

Based on Table 2 as above, it is possible to consider as follows. Specimens Nos. 11 to 18 each represent a case where requirements specified by the present invention were met, and since a Ti-bearing Cu-alloy contains N and/or Dy, the high-temperature reflow properties were found excellent, thereby enabling the Cu-alloy to be embedded in the recesses with reliability. In contrast, specimens Nos. 19 to 26 each represent a case where the requirements specified by the present invention were not met, so that the Cu-alloy was not found fully embedded in the recesses. Further, specimens Nos. 27 to 39 each represent a comparative example for verifying an effect (the high-temperature reflow properties) of Cu containing no Ti when the same is caused to contain N or Dy.

WORKING EXAMPLE 3

Use was made of evaluation elements (TEGs) each provided with a groove having a minimum width in a range of 0.05 to 0.13 μm, a depth 0.3 μm, and a length 2.0 mm, or a hole having a diameter in a range of 0.05 to 0.13 μm, and a depth 0.3 μm, as shown in Table 3 below, in an insulating film (TEOS film: SiOF film) formed on the top surface of a silicon wafer. A Cu-alloy thin film containing 1.0 at % of Ti, 0.5 at % of Dy, and 0.4 at % of N was formed to a thickness of 750 nm by the sputtering, and parts of the respective TEGs, corresponding to a interconnection pattern, were covered by the thin film. The sputtering was carried out under the same condition as for Working Example 1 except that an atmosphere of an Ar gas containing 2.5 vol. % of N (a mixed gas of Ar and $N_2$) was used.

Next, an annealing and pressurizing treatment was applied to the TEGs covered with the Cu-alloy thin film. The annealing and pressurizing treatment was carried out such that the thin film was pressurized to respective pressures shown in Table 3 below in the atmosphere of the Ar gas, and was heated from room temperature to respective temperatures shown in Table 3 at a heating rate of 20° C./min to be held at each of those temperature for 120 min before being cooled down to room temperature at a cooling rate of 20° C./min.

As with the case of working Example 2, embedding properties of the Cu-alloy were examined with respect to the respective TEGs after the annealing and pressurizing treatment was applied thereto. Respective embedding ratios are shown in Table 3 below.

TABLE 3

| No. | Shape | Minimum Width Ratio (μm) | Depth (μm) | Depth/Minimum Width Ratio | Heating and Pressurizing Treatment | | Embedding Ratio (%) |
|---|---|---|---|---|---|---|---|
| | | | | | Temperature (° C.) | Pressure (MPa) | |
| 41 | Groove | 0.13 | 0.3 | 2.3 | 500 | 150 | 100 |
| 42 | Groove | 0.1 | 0.3 | 3.0 | 500 | 150 | 100 |
| 43 | Groove | 0.07 | 0.3 | 4.3 | 500 | 150 | 98.2 |
| 44 | Groove | 0.05 | 0.3 | 6.0 | 500 | 150 | 88.4 |
| 45 | Hole | 0.13 | 0.3 | 2.3 | 500 | 150 | 100 |
| 46 | Hole | 0.1 | 0.3 | 3.0 | 500 | 150 | 100 |
| 47 | Hole | 0.07 | 0.3 | 4.3 | 500 | 150 | 96.5 |
| 48 | Hole | 0.05 | 0.3 | 6.0 | 500 | 150 | 85.3 |
| 49 | Hole | 0.1 | 0.3 | 3.0 | 200 | 150 | 50.6 |
| 50 | Hole | 0.1 | 0.3 | 3.0 | 200 | 200 | 53.2 |
| 51 | Hole | 0.1 | 0.3 | 3.0 | 400 | 150 | 71.6 |
| 52 | Hole | 0.1 | 0.3 | 3.0 | 400 | 200 | 76.1 |
| 53 | Hole | 0.1 | 0.3 | 3.0 | 450 | 150 | 94.3 |
| 54 | Hole | 0.1 | 0.3 | 3.0 | 550 | 150 | 100 |

TABLE 3-continued

| | | Minimum | | | Heating and Pressurizing Treatment | | |
|---|---|---|---|---|---|---|---|
| No. | Shape | Width Ratio (μm) | Depth (μm) | Depth/Minimum Width Ratio | Temperature (° C.) | Pressure (MPa) | Embedding Ratio (%) |
| 55 | Hole | 0.1 | 0.3 | 3.0 | 600 | 150 | 100 |
| 56 | Hole | 0.1 | 0.3 | 3.0 | 650 | 150 | 100 |

A minimum width refers to a width at the minimum value in the case of the groove, and refers to a diameter in the case of the hole.

Based on Table 3 as above, it is possible to consider as the follows. Specimens Nos. 41 to 48 each represent a case where the Cu-alloy was embedded into the grooves and holes, differing in a minimum width from each other under the same annealing and pressurizing conditions. With the Specimens Nos. 41 to 48, the smaller the minimum width of the groove, or the hole, the more deterioration the embedding ratio undergoes. With the present invention, however, it was found that even in the case of the groove, or the hole, having the minimum width 0.05 μm and the depth/minimum width ratio at 6, not less than 85% of the Cu-alloy could be embedded in the groove, or the hole.

Specimens Nos. 49 to 56 each represent a case where the hole was kept constant in shape while the annealing and pressurizing conditions were varied, and it is evident that the embedding ratio is under the influence of the annealing temperature.

WORKING EXAMPLE 4

With reference to the specimens Nos. 12, 13 of Working Example 2, and the specimen No. 42 of Working Example 3, observation was made on the cross-sections of the respective specimens, each showing a stacked condition of the film, as magnified 200,000 to 500,000 times by the transmission electron microscope (TEM). As a result, a $TiO_2$ layer as the Ti-concentration layer was found formed between the insulating film and the Cu-alloy.

Further, as with the case of Working Example 1, observation was made on the neighborhood of an interface between the insulating film and the Cu-alloy to check whether or not Cu is diffused into the insulating film. As a result, Cu was not found diffused into the insulating film

WORKING EXAMPLE 5

Respective Cu-alloy thin films, having various chemical compositions shown in Table 4 below, were formed to a thickness of 300 nm by the DC-magnetron sputtering on the surface of a substrate with an insulating film (TEOS film: SiOF film) formed on a silicon wafer. The sputtering was carried out under the same condition as for Working Example 1 except that an atmosphere gas was changed in composition so as to be the atmosphere of the Ar gas, or an atmosphere of a mixed gas of Ar and $N_2$, as shown in Table 4 below.

The respective Cu-alloy thin films formed were worked into patterns for measurement of electric resistivity by use of photolithography, and wet etching, and resistances of respective interconnections 10 mm long were measured by the four-point probe method. The resistances (an electric resistivity) of the respective interconnections were first measured at room temperature, and thereafter, heat treatment for retaining respective predetermined temperatures (200° C., 300° C., 400° C., and 500° C.) for two hours was applied thereto under a normal pressure, and under an Ar atmosphere, thereby having measured the resistances (the electric resistivity) of the respective interconnections at the respective temperatures.

TABLE 4

| | Chemical Composition (%) | | | | Sputtering Gas (vol. %) | |
|---|---|---|---|---|---|---|
| No. | Ti | N | Dy | Cu | $N_2$ | Ar |
| 61 | 3.0 | — | — | Balance | — | 100 |
| 62 | 3.0 | 1.0 | — | Balance | 6.3 | Balance |
| 63 | 3.0 | 2.5 | — | Balance | 15.5 | Balance |
| 64 | 3.0 | 5.0 | — | Balance | 31.0 | Balance |
| 65 | 3.0 | — | 0.5 | Balance | — | Balance |
| 66 | 3.0 | 1.0 | 0.5 | Balance | 6.3 | Balance |

Figure 2:
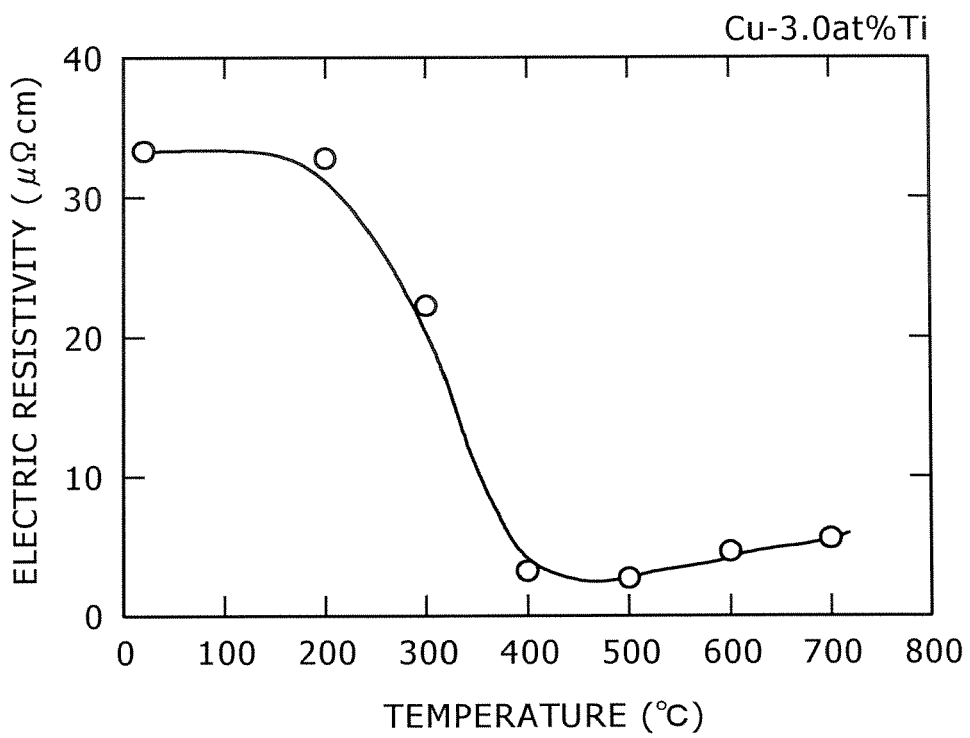
FIG. 2 is a graph showing a relationship between an annealing temperature and an electric resistivity with reference to a specimen No. 61 in Table 4.

With reference to a specimen No. 61 in Table 4, a relationship between an annealing temperature and electric resistivity is shown in FIG. 2. As is evident from FIG. 2, it is shown that an electric resistivity of an interconnection of the specimen No. 61 prior to the annealing and pressurizing treatment was found high, but the electric resistivity thereof was found falling upon annealing the same. After heated to 400° C. or higher, in particular, the electric resistivity was found falling to not more than 4 μΩ·cm. The electric resistivity was shown at the minimum value when heated to 500° C., and at that point in time, the electric resistivity was at 2.8 μΩ·cm. This value can be said to be a sufficiently low as resistance of an interconnection suitable for use in LSIs.

Figure 3:
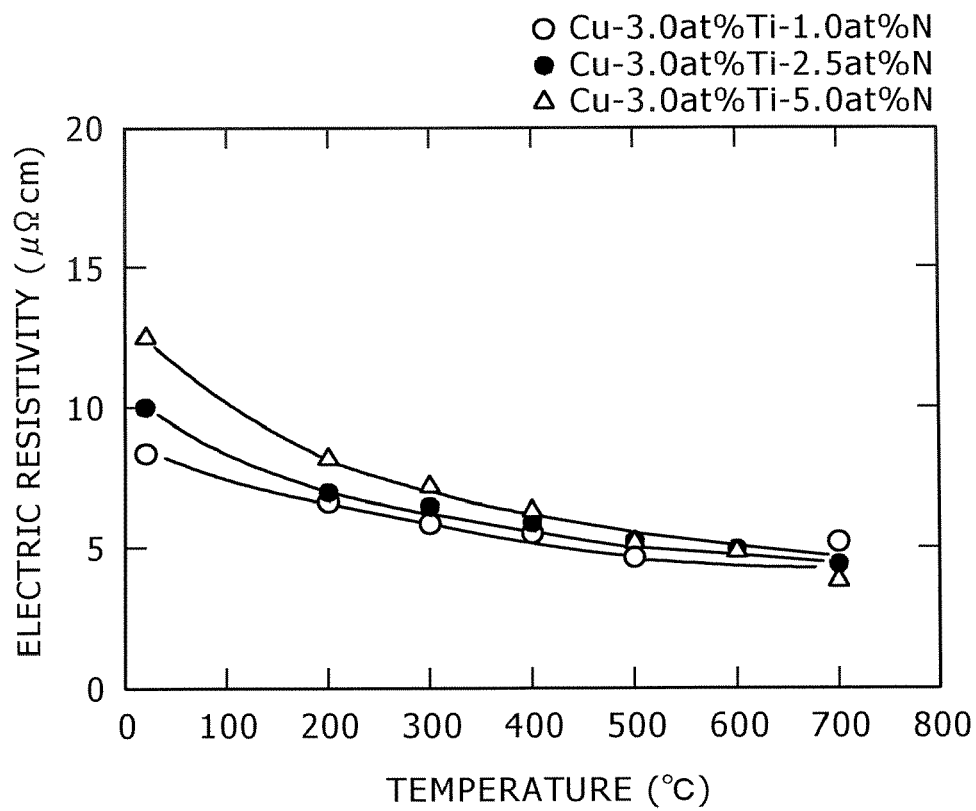
FIG. 3 is a graph showing a relationship between an annealing temperature and an electric resistivity with reference to specimens No. 62 to No. 64, in Table 4.

With reference to specimens Nos. 62 to 64 in Table 4, a relationship between an annealing temperature and electric resistivity is shown in FIG. 3. In FIG. 3, measurement results of the specimen No. 62 were denoted by symbol ○, measurement results of the specimen No. 63 were denoted by symbol ●, and measurement results of the specimen No. 64 were denoted by symbol ∆, respectively. As is evident from FIG. 3, it is shown that electric resistivities of interconnections of the respective specimens Nos. 62 to 64, prior to the annealing and pressurizing treatment, were found lower than that for the interconnection of the specimen No. 61, due to the former containing N. Further, it is shown that as the annealing temperature is increased, so the electric resistivity of the Cu-alloy can be gradually lowered. In the case of the Cu-alloy containing no Dy, the electric resistivity of the respective interconnections when heated to 200° C. or higher were found falling to not more than 6 μΩ·cm, proving that it is possible to obtain interconnections of low resistance level, suitable for use in LSIs.

With reference to specimens Nos. 65 and 66, in Table 4, a relationship between an annealing temperature and electric resistivity is shown in FIG. 4. As is evident from FIG. 4, it is shown that as the annealing temperature is increased, so the electric resistivity of the Cu-alloy can be lowered. In the case of the Cu-alloy containing Dy, the electric resistivity of respective interconnections when heated to 400° C. or higher were found falling to not more than 6 μΩ·cm, proving that it is possible to obtain interconnections of a low resistance level, suitable for use in LSIs.

What is claimed is:

1. A method for fabricating semiconductor interconnections of a Cu-alloy embedded in respective recesses provided in an insulating film on a semiconductor substrate, said method comprising the steps of:
    forming the respective recesses having a minimum width not more than 0.15 μm, and a ratio of a depth thereof to the minimum width (a depth/minimum width ratio) not less than 1;
    forming a Cu-alloy film containing Ti in a range of 0.5 to 3 at %, and N in a range of 0.4 to 2.0 at % over the respective recesses; and
    subsequently, annealing the Cu-alloy film to not lower than 200° C., and pressurizing the Cu-alloy film to not less than 50 MPa to thereby embed the Cu-alloy film into the respective recesses.

2. A method for fabricating semiconductor interconnections of a Cu-alloy embedded in respective recesses provided in an insulating film on a semiconductor substrate, said method comprising the steps of:
    forming the respective recesses having a minimum width not more than 0.15 μm, and a ratio of a depth thereof to the minimum width (a depth/minimum width ratio) not less than 1;
    forming a Cu-alloy film containing Ti in a range of 0.5 to 3 at %, and Dy in a range of 0.01 to 3 at % over the respective recesses; and
    subsequently, annealing the Cu-alloy film to not lower than 400° C., and pressurizing the Cu-alloy film to not less than 50 MPa to thereby embed the Cu-alloy film into the respective recesses.

3. A method according to claim 2, wherein the Cu-alloy film containing also N in a range of 0.4 to 2.0 at % is formed.

4. A method according to claim 1, wherein the Cu-alloy film is formed by the sputtering method under an atmosphere of an inert gas containing N2 in a range of 2.5 to 12.5 vol. %.

5. A method according to claim 3, wherein the Cu-alloy film is formed by the sputtering method under an atmosphere of an inert gas containing N2 in a range of 2.5 to 12.5 vol. %.

6. The method of claim 1, wherein during the annealing the Ti in the Cu-alloy film at least partially diffuses to form a Ti layer between the insulating film and the Cu-alloy film, wherein the Ti layer has a higher concentration of Ti than the Cu-alloy film.

7. The method of claim 1, wherein the recesses are formed in the insulating film on the semiconductor substrate; and
    wherein the annealing forms a Ti layer directly adjacent to the insulating film and the Cu-alloy film directly adjacent to the Ti layer, wherein the Ti layer has a higher concentration of Ti than the Cu-alloy film.

8. The method of claim 1, wherein the annealing releases $N_2$ from the Cu-alloy film layer.

9. The method of claim 6, wherein the Ti layer comprises TiN and Cu.

10. The method of claim 7, wherein the Ti layer comprises TiN and Cu.

11. The method of claim 1, wherein the insulating film is an $SiO_2$ film, and the annealing forms a Ti layer adjacent to the insulating layer and a Cu film adjacent to the Ti layer;
    wherein the Ti layer comprises titanium oxides and copper.

12. The method of claim 1, wherein the Cu-alloy film comprises Ti in an amount of from 1 to 2.5 at %.

13. The method of claim 1, wherein the Cu-alloy film comprises from 0.6 to 1.8 at % of N.

14. The method of claim 6, wherein the Ti layer has a thickness of from 3 to 17 nm.

15. A semiconductor interconnection formed by the method of claim 1.

16. The method of claim 2, wherein, during the annealing, the Ti in the Cu-alloy film at least partially diffuses to form a Ti layer between the insulating film and the Cu-alloy film, wherein the Ti layer has a higher concentration of Ti than the Cu-alloy film.

17. The method of claim 2, wherein the recesses are formed in the insulating film on the semiconductor substrate; and
    wherein the annealing forms a Ti layer directly adjacent to the insulating film and a Cu layer directly adjacent to the Ti layer, wherein the Ti layer has a higher concentration of Ti than the Cu-alloy film.

* * * * *